(12) United States Patent
Cartagena

(10) Patent No.: US 6,404,038 B1
(45) Date of Patent: *Jun. 11, 2002

(54) COMPLEMENTARY VERTICAL BIPOLAR JUNCTION TRANSISTORS FABRICATED OF SILICON-ON-SAPPHIRE UTILIZING WIDE BASE PNP TRANSISTORS

(75) Inventor: Eric N. Cartagena, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/517,292

(22) Filed: Mar. 2, 2000

(51) Int. Cl.⁷ .................... H01L 27/082; H01L 27/102
(52) U.S. Cl. .................... 257/586; 257/511; 257/565
(58) Field of Search ................ 257/566–569, 257/571, 573, 586, 511

(56) References Cited

U.S. PATENT DOCUMENTS

| | | | |
|---|---|---|---|
| 3,943,555 A | | 3/1976 | Mueller et al. |
| 3,974,560 A | | 8/1976 | Mueller et al. |
| 4,050,965 A | | 9/1977 | Ipri et al. |
| 4,127,860 A | | 11/1978 | Beelitz et al. |
| 4,546,536 A | * | 10/1985 | Anantha et al. .............. 29/571 |
| 4,665,425 A | | 5/1987 | Piotrowski |
| 4,717,680 A | | 1/1988 | Piotrowski |
| 4,792,837 A | | 12/1988 | Zazzu |
| 4,843,448 A | | 6/1989 | Garcia et al. |
| 4,908,691 A | | 3/1990 | Silvestri et al. |
| 5,049,964 A | | 9/1991 | Sakai et al. |
| 5,061,646 A | | 10/1991 | Sivan et al. |
| 5,198,375 A | | 3/1993 | Hayden et al. |
| 5,294,823 A | * | 3/1994 | Eklund et al. .............. 257/370 |
| 5,298,786 A | | 3/1994 | Shahidi et al. |
| 5,374,567 A | | 12/1994 | Cartagena |
| 5,641,691 A | * | 6/1997 | Cartagena et al. .......... 438/311 |
| 5,714,793 A | | 2/1998 | Cartagena et al. |

OTHER PUBLICATIONS

Stanley Wolf Ph.D., "Silicon Processing for the VLSI Era, vol. 2: Process Integration," 1990, Lattice Press, pp. 473–474.*

Gupta et al., "Recent Advances in Hetero–Epitaxial Silicon–on–Insulator Technology, Part II", *Solid State Technology*, Jun. 1983, pp. 129–134, 26.

Ragay et al., "Complementary Vertical Bipolar Transistor Process Using High–Energy Ion Implantation", *Electronics Letters*, Nov. 7, 1991, pp. 2141–2143, vol. 27.

Heiman et al., "Silicon–on–Sapphire Epitaxial Bipolar Transistors", *Solid State Electronics*, 1968, pp. 411–418, vol. 11.

Vasudev, "Recent Advances in Solid Phase Epitaxial Recrystallization of SOS with Applications to CMOS and Bipolar Devices", *IEEE Circuits and Devices Magazine*, Jul. 1987, pp. 17–19.

* cited by examiner

*Primary Examiner*—Allan R. Wilson
(74) *Attorney, Agent, or Firm*—Harvey Fendelman; Michael A. Kagan; Peter A. Lipovsky

(57) ABSTRACT

A method for fabricating complementary vertical bipolar junction transistors of silicon-on-sapphire in fewer steps than required for true complimentary vertical bipolar junction transistors is disclosed. Initially a thin layer of silicon is grown on a sapphire substrate. The silicon is improved using double solid phase epitaxy. The silicon is then patterned and implanted with P+-type and N+-type dopants. Subsequently a micrometer scale N-type layer is grown that acts as the intrinsic base for both an PNP transistor and as the collector for an NPN transistor. The extrinsic base for the NPN is then formed and the emitter, collector and ohmic contact regions are next selectively masked and implanted. Conductive metal is then formed between protecting oxide to complete the complementary vertical bipolar junction transistors.

7 Claims, 17 Drawing Sheets

KEY: m = metal  o = oxide
     e = emitter

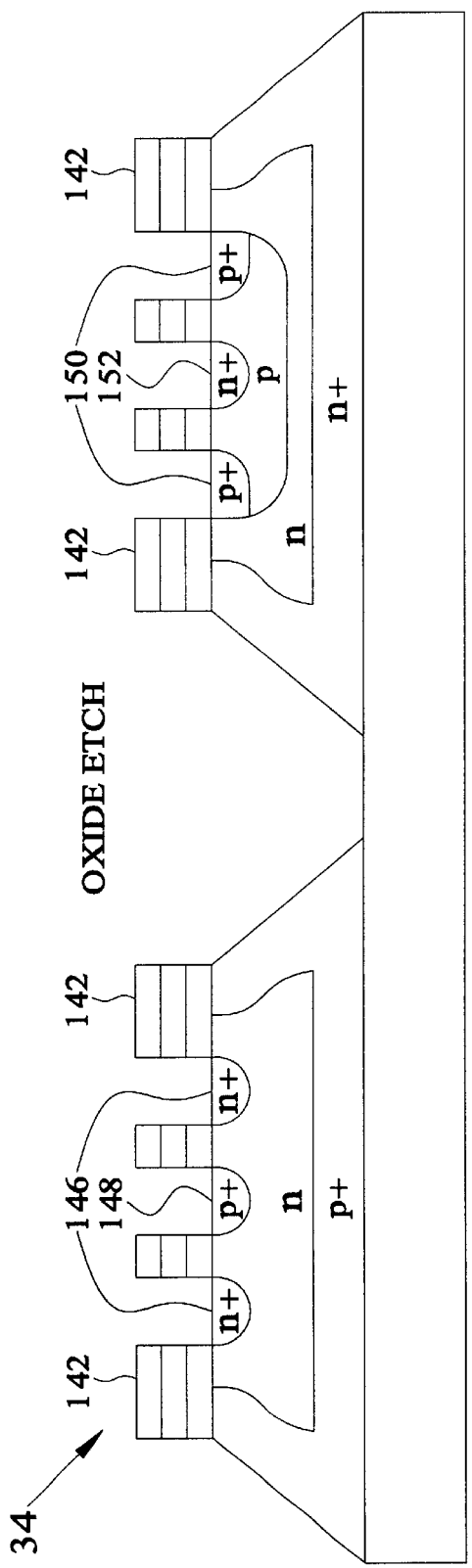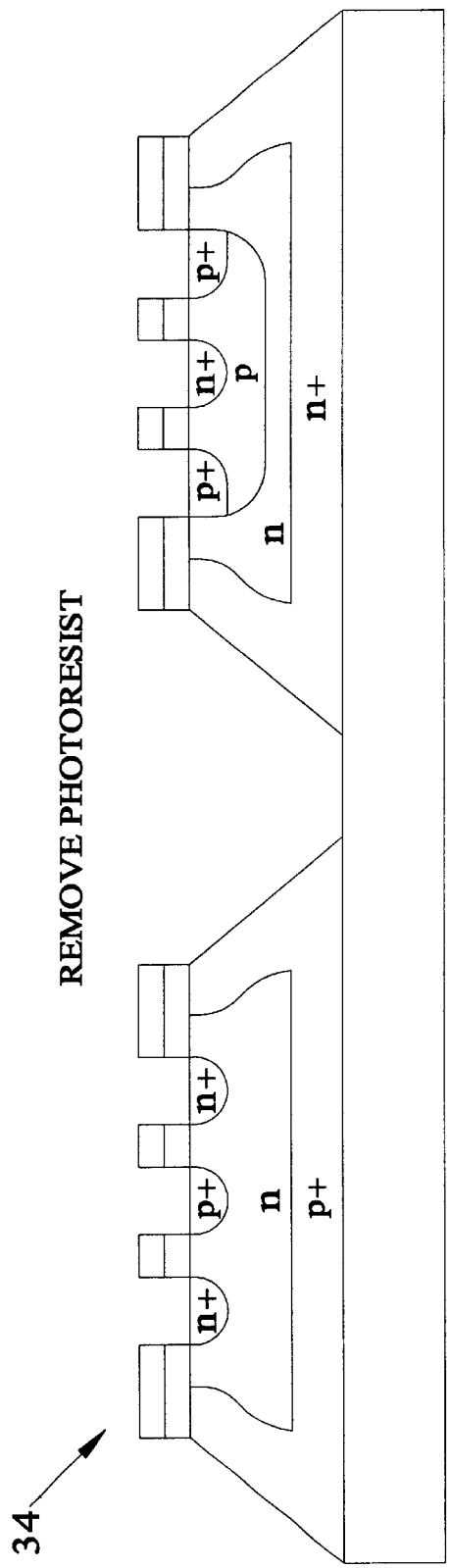
FIG. 31
FIG. 32

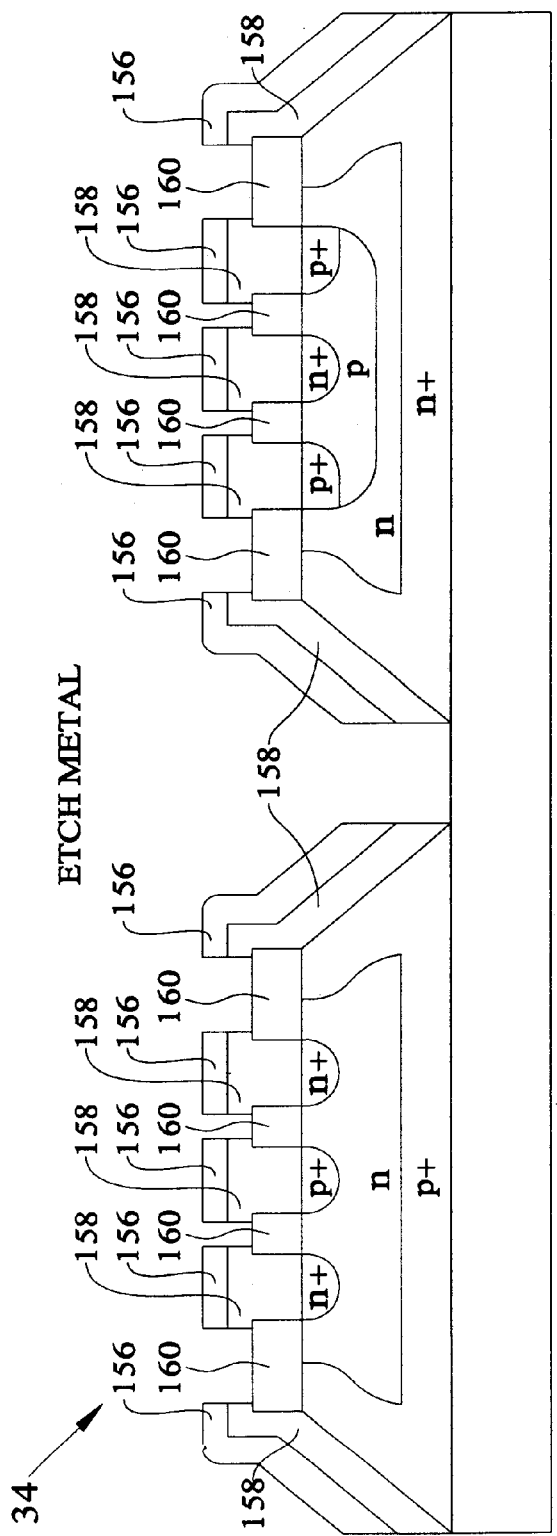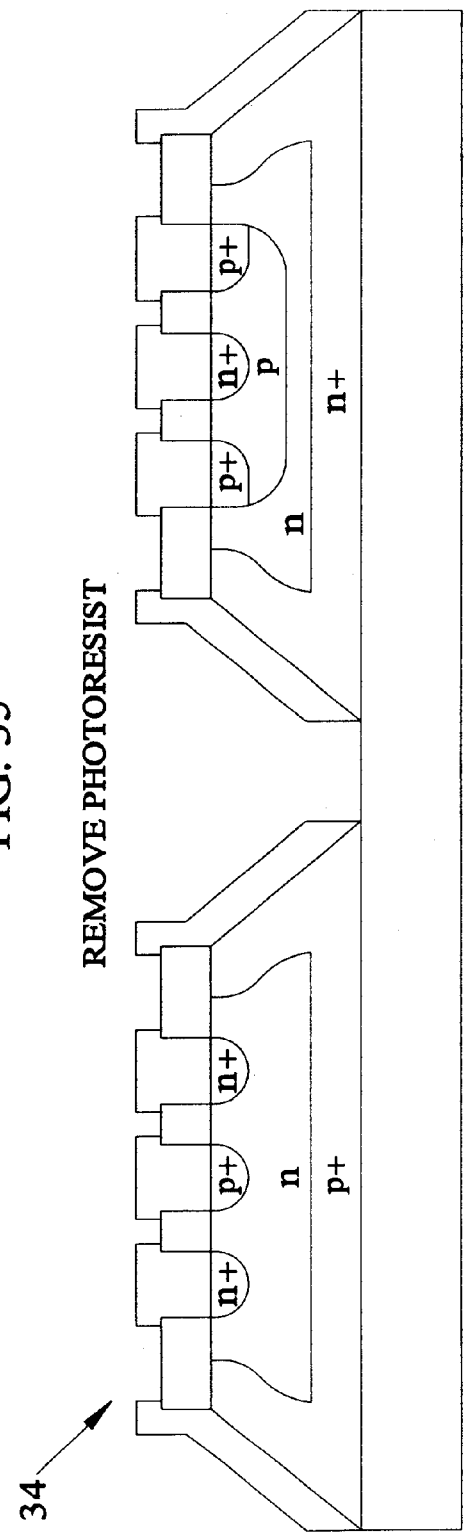
FIG. 35
FIG. 36

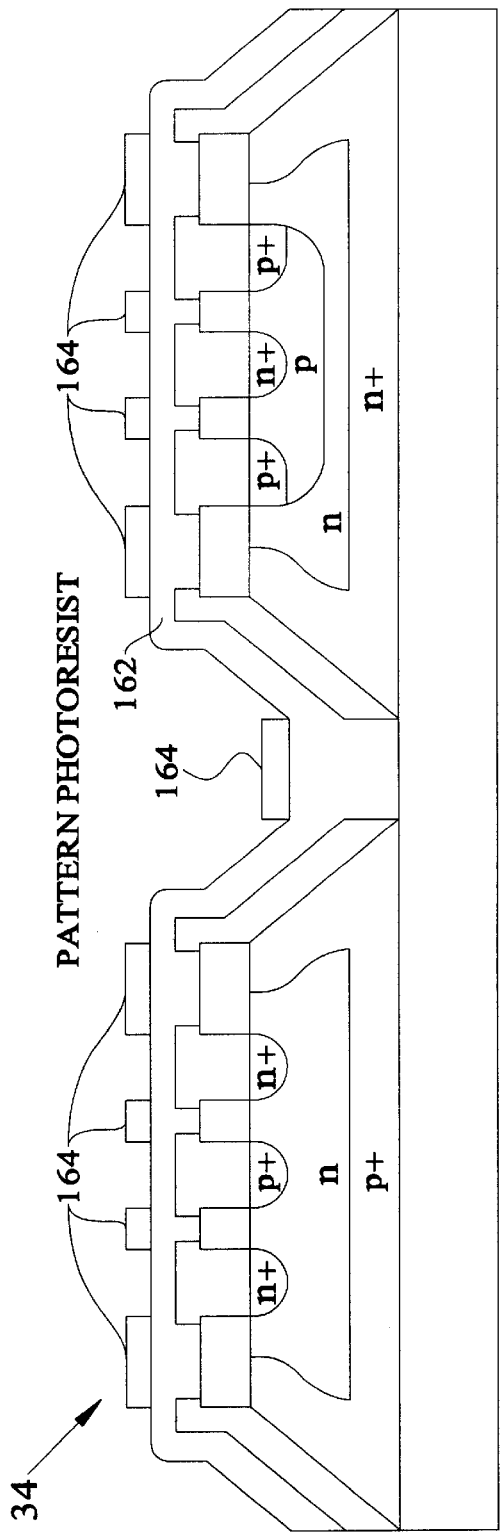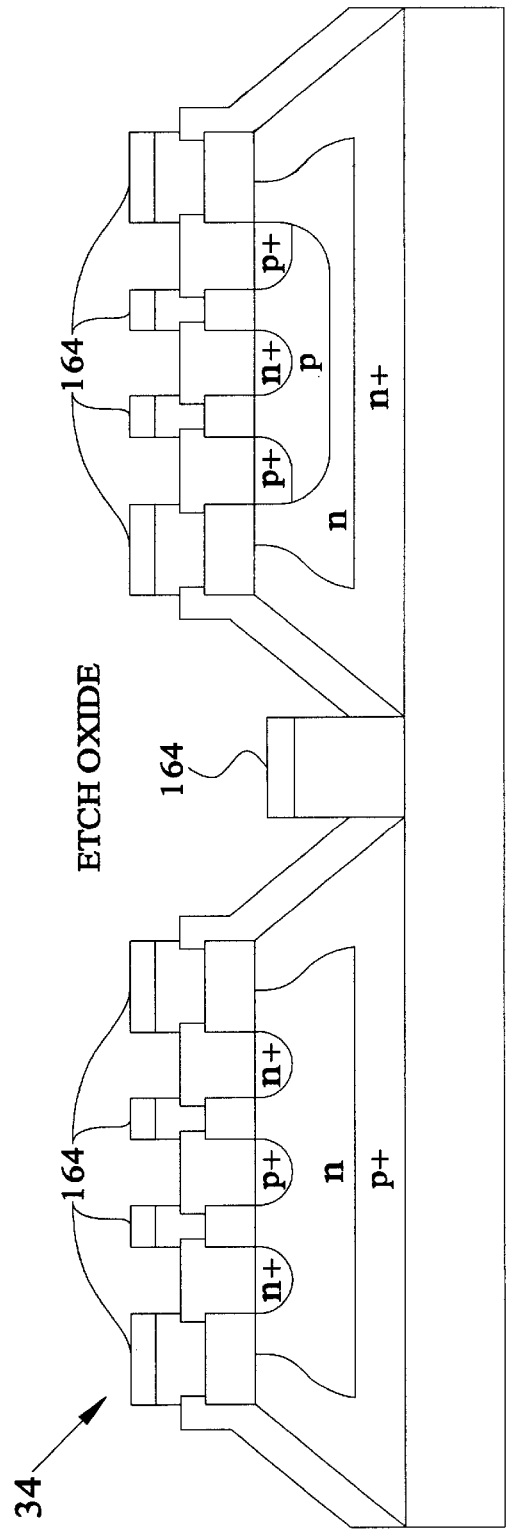
FIG. 39
FIG. 40

KEY: m = metal  o = oxide
e = emitter

COMPLEMENTARY VERTICAL BIPOLAR JUNCTION TRANSISTORS FABRICATED OF SILICON-ON-SAPPHIRE UTILIZING WIDE BASE PNP TRANSISTORS

BACKGROUND OF THE INVENTION

This invention relates generally to a method for making bipolar transistors. More particularly, the invention relates to a method of making complementary vertical bipolar junction transistors fabricated in silicon on a sapphire substrate.

Many semiconductor electronic devices are fabricated on a bulk, crystalline, silicon substrate. Yet, for a number of specific devices and applications, a better choice of substrate material is sapphire. In such cases, a thin layer of silicon is deposited on an insulating sapphire base. This combination has become known as silicon-on-sapphire, and is a specific example of what is known as silicon-on-insulator technology.

Bipolar junction transistors fabricated of silicon-on-sapphire technology have several important advantages when compared to transistors fabricated on bulk silicon. Total isolation between transistors is possible by removing any silicon surrounding the transistors down to the sapphire level. This produces an island that inhibits cross-talk between closely located devices and improves chip reliability when packing density is high.

It is known that bipolar transistors experience problems associated with parasitic capacitance. The severity of this capacitance increases as transistors are made smaller. Because of the insulating qualities of the sapphire substrate, relatively little capacitance between a transistor's collector and the sapphire will exist. In addition, all interconnecting lines can be located on the sapphire substrate, thereby contributing little to parasitic capacitance. This allows high-frequency components to be located relatively near one another on the same chip, with the benefit of unwanted feedback being eliminated or substantially reduced. Thus the speed and reliability of transistors fabricated of silicon-on-sapphire is typically enhanced.

It is also known that silicon-on-sapphire devices are more radiation hardened than those fabricated on bulk silicon. Such radiation hardness permits devices to operate more effectively in environments containing high levels of ionizing radiation.

While the attributes of fabricating bipolar junction transistors of silicon-on-sapphire are well known, such fabrication has been accomplished with varying degrees of success. An early approach to fabricating this type of transistor based on silicon epitaxial growth on a sapphire substrate can be found in U.S. Pat. No. 4,050,965. This patent describes a process for fabricating bipolar junction transistors integrated with CMOS devices formed laterally on the L same integrated circuit. Other early examples of methods for making bipolar transistors of silicon-on-sapphire can be found in U.S. Pat. No. 3,943,555 which discloses the use of ion implantation to produce a planar bipolar junction transistor that is isolated on a substrate. U.S. Pat. No. 3,974,560 discloses the use of ion implantation and diffusion to fabricate a lateral bipolar transistor.

More recent methods for fabricating a lateral bipolar junction transistor can be found in U.S. Pat. No. 5,298,786, which describes the use of polysilicon in the fabrication of a transistor having an edge-strapped base contact. U.S. Pat. No. 5,198,375 discloses the use of a dielectric layer to form both vertical and lateral transistor devices. U.S. Pat. No. 5,374,567 describes a method of fabricating a low leakage current bipolar junction transistor on silicon-on-sapphire for use in operational amplifiers utilizing all-implant technology, improved silicon conditioning and low temperature annealing. In U.S. Pat. No. 5,714,793, an intricate process is used to fabricate true complementary vertical bipolar junction transistors of silicon-on-sapphire.

Most of the development of bipolar junction transistors of silicon-on-sapphire has been concentrated in the area of lateral bipolar junction transistors, epitaxial vertical bipolar junction transistors, and heteroepitaxy bipolar junction transistors. This work has been recorded respectively by P. K. Vasudev in his article in the IEEE Circuits and Devices magazine titled: Recent Advances in Solid-Phase Epitaxial Recrystallization of SOS with Applications to CMOS and Bipolar Devices, of July 1987, pp. 17–19: by F. P. Heiman and P. H. Robinson in their article in *Solid State Electronics* titled: Silicon-on-Sapphire Epitaxial Bipolar Transistors of 1968, Volume 11, pp. 411–418; and by E. N. Cartagena, B. W. Offord and G. Garcia in their article in *Electronics Letters* titled: Bipolar Junction Transistors Fabricated in Silicon-on-Sapphire of 1992, Volume 28, pp. 983–985.

Traditional bipolar circuitry relies on high performance vertical devices for many of the circuit dynamic functions, while lateral devices provide the biasing and loading functions of the circuit. Experience has shown that lateral devices provide poor circuit element performance, such as low current gain, inadequate current carrying capability and low frequency response. In addition, lateral bipolar transistors occupy a relatively large area of a substrate and typically have high parasitic capacitance. In many applications, limitations of a circuit are determined by the poor performance of the lateral devices. As a consequence, vertical bipolar transistors are commonly chosen for use in high performance/high speed integrated circuits.

Complementary bipolar circuits with high performance vertical devices in the signal path offer enhanced capability of push-pull circuits for both analog and digital applications. Complementary bipolar circuits can also reduce power dissipation, increase switching speed and improve the flexibility of the overall circuit design.

Specific benefits gained by fabricating complementary bipolar circuits of silicon-on-sapphire technology include latch-up immunity, the ability to achieve high packing density, radiation hardness and the capability of operating circuits at a higher frequency response.

In a typical silicon-on-sapphire device, the thickness of the epitaxial layer of silicon on the sapphire base is between 0.5 and 5 micrometers ($\mu$m). The quality of this silicon epitaxial layer will play a direct role in the success of the silicon-on-sapphire device. Poor quality silicon will prevent the fabrication of a satisfactory bipolar junction transistor when diffusion of impurities into the silicon layer is required.

The silicon layer on a sapphire substrate will generally lack good crystal structure when compared to bulk silicon. In addition, a relatively higher density of defects in the epitaxial silicon will be found when compared to bulk silicon. A problem associated with the larger defect density is low minority carrier lifetime. Lifetimes that range from as low as 0.1 ns to 10 ns are typical for these epitaxial layers, compared to minority carrier lifetimes of 100 ns to 1 microsecond or more for bulk silicon. Since a bipolar junction transistor is a minority carrier device, efficient operation requires a relatively high minority carrier lifetime in the base region.

To improve the quality of a silicon epitaxial layer on a sapphire base, recrystallization techniques have been used.

One such process, known as the double solid phase epitaxy technique, has been described by P. K. Vasudev in his 1987 article in *IEEE Circuits and Devices* noted above.

While recrystallization techniques improve the quality of the silicon epitaxial layer, further improvements are required to make bipolar junction transistors more practical for many semiconductor circuit applications. Such practicality could be advanced by a process of fabricating complimentary vertical bipolar junction transistors having fewer steps than those required for true complementary vertical bipolar junction transistors.

SUMMARY OF THE INVENTION

The invention is a method for fabricating complementary vertical bipolar junction transistors of silicon-on-sapphire in fewer steps than required for true complimentary vertical bipolar junction transistors. Initially a thin layer of silicon is grown on a sapphire substrate. The silicon layer is improved using double solid phase epitaxy. The silicon is then patterned and implanted with P+-type and N+-type dopants. Subsequently a micrometer scale N-type layer is grown that acts as both the intrinsic base for an PNP transistor and as the collector for an NPN transistor. The intrinsic base for the NPN is then formed, followed by the emitter, collector and ohmic contact regions being selectively masked and implanted. Conductive metal is then formed between protecting oxide to complete the complementary vertical bipolar junction transistors.

An object of the invention is to provide an improved method for fabricating vertical bipolar junction transistors.

Another object of the invention is to provide an improved method for fabricating vertical bipolar junction transistors.

Yet another object of the invention is to provide an improved method for fabricating complementary vertical bipolar junction transistors.

Yet still another object of the invention is to provide a simplified method for fabricating complementary vertical bipolar junction transistors.

Still another object of the invention is to provide an improved method for fabricating complementary vertical bipolar junction transistors of silicon-on-sapphire.

Still a further object of the invention is to provide an improved method for fabricating complementary vertical bipolar junction transistors of silicon-on-sapphire utilizing wide base PNP transistors.

Other objects, advantages and new features of the invention will become apparent from the following detailed description of the invention when considered in conjunction with the accompanied drawings.

BRIEF DESCRIPTION OF THE DRAWING

FIGS. 2–41 show exemplary processing steps for fabricating complementary vertical bipolar junction transistors of silicon-on-sapphire according to the invention.

DETAILED DESCRIPTION OF THE PREFERRED EMBODIMENT

Figure 1A:
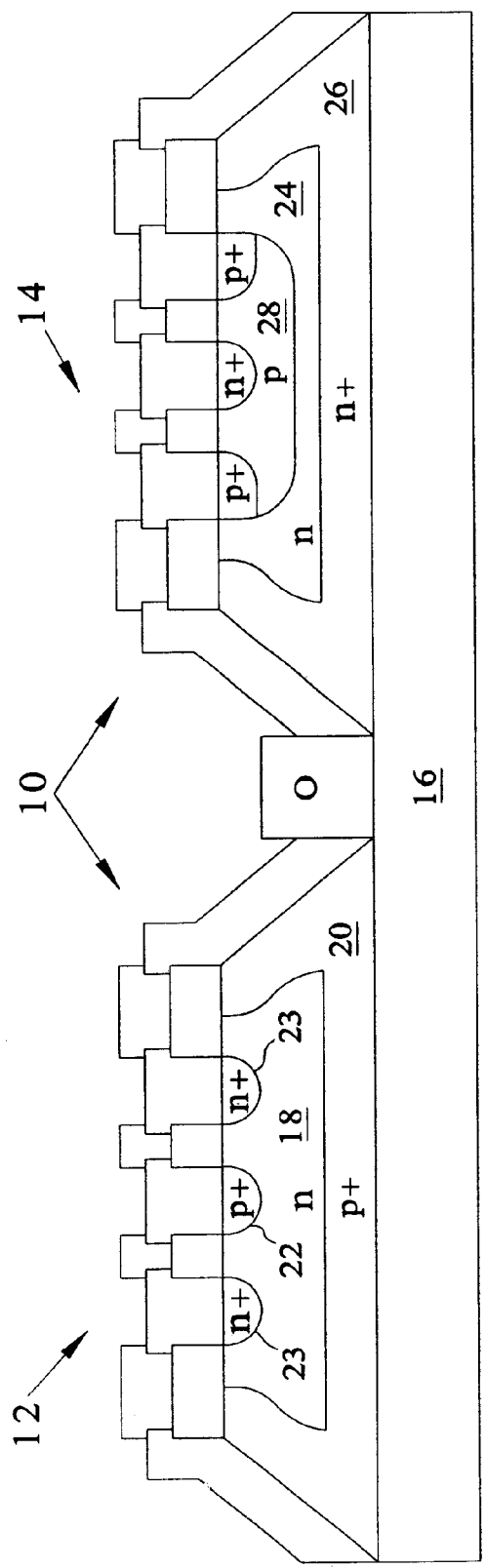
FIGS. 1A and 1B show cross-sectional views of complementary vertical bipolar junction transistors as may be fabricated according to the invention.
Figure 1B:
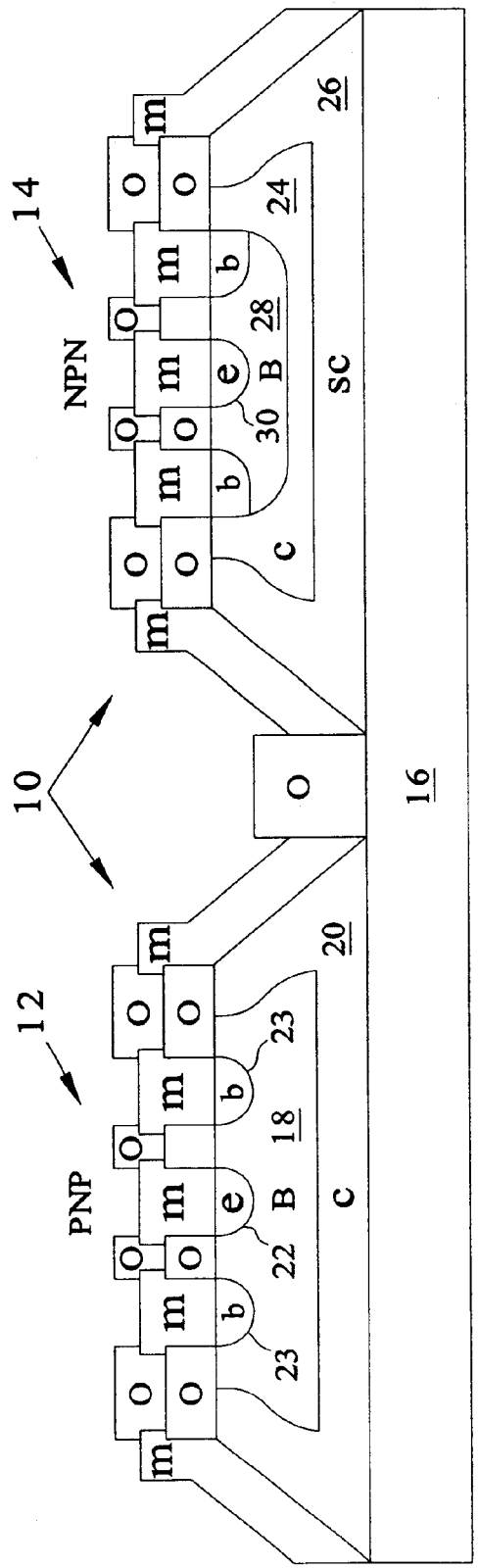

Referring to FIGS. 1A and 1B, cross-sectional views of complimentary vertical bipolar junction transistors 10 fabricated of silicon-on-sapphire according to the invention are shown. The elements of these transistors will be discussed first. Following this will be a discussion of the steps used to fabricate these transistors.

The complementary vertical bipolar junction transistors include PNP vertical transistor 12 and NPN vertical transistor 14 sharing a sapphire substrate 16. Base region 18 of PNP transistor 12 is formed of silicon of N-type conductivity. Region 18, also shown as "B", is of a wide base and is disposed to contact collector region 20. Collector region 20, also shown as "c", includes silicon with P+-type conductivity and is disposed in contact with sapphire substrate 16. Emitter region 22, shown also as "e", includes silicon with P+-type conductivity and is formed within base region 18 of PNP transistor 12. Also formed within base region 18 are ohmic contacts 23 ("b") that are used in conjunction with some conducting metal contacts "m".

NPN vertical bipolar junction transistor 14 includes collector region 24 ("c") of silicon with N-type conductivity. Collector region 24 is disposed in contact with sub-collector ("sc") region 26 which further lies in contact with substrate 16. Base region ("B") 28 of vertical bipolar transistor 14 is composed of silicon with P-type conductivity. Emitter region 30 ("e") is of silicon with N+-type conductivity and is formed within base region 28. Also formed within base region 28 are ohmic contacts "b" for use with some of the conducting metal contacts "m". As is shown in FIG. 1B, conducting metal surfaces ("m") are illustrated as well as are oxide layers "o".

Vertical bipolar PNP transistor 12 and vertical bipolar NPN transistor 14 are physically isolated from one another, to minimize cross-talk. This is accomplished by removing conducting silicon from region 32 between the two transistors. The only remaining material in contact with PNP transistor collector 20 and NPN transistor sub-collector region 26 is insulating sapphire substrate 16.

Referring now to FIGS. 2–27, an exemplary series of semiconductor processing steps according to the invention are shown. These steps may be used to fabricate the complementary vertical bipolar transistors of silicon-on-sapphire according to the invention.

Figure 2:
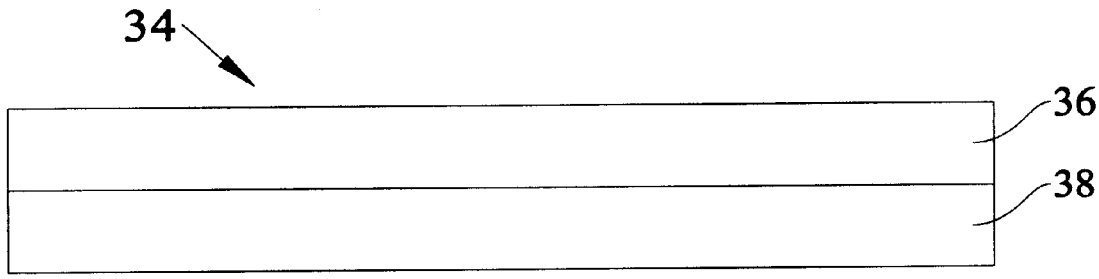

Referring to FIG. 2, a wafer 34 includes a layer 36 of silicon grown on a sapphire substrate 38 by any traditional method such as heteroepitaxy. This layer may be approximately 0.3 micrometers thick, for example, however other thicknesses may be used. The quality of the grown silicon is improved by a recrystallization technique such as double solid phase epitaxy, described by P. K. Vasudev in his 1987 article in *IEEE Circuits and Devices* noted above and incorporated by reference herein.

Figure 3:
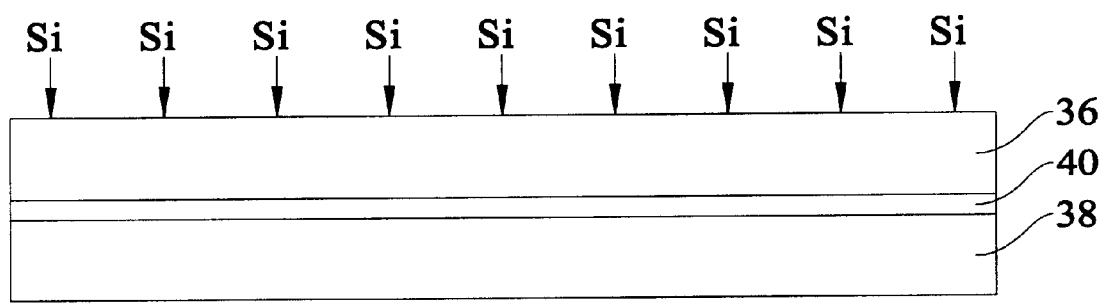

Such recrystallization processing is illustrated in FIGS. 3–6, and begins with reference to FIG. 3 with the amorphization of silicon at silicon-sapphire interface region 40. The amorphization may be accomplished by using an implant of $Si^{28}$ at an energy of 185 kilo-electron volts (KeV) and at a dose of $6 \times 10^{14}$ ions/cm$^2$, for example.

Figure 4:
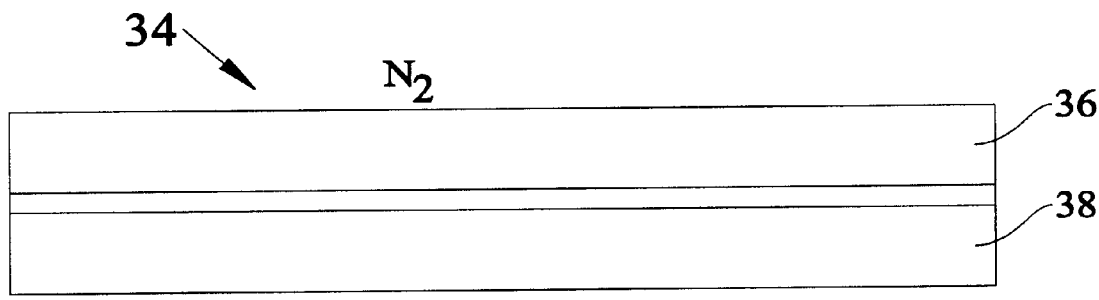

Referring to FIG.4, the recrystallization improvement process is shown furthered in which an anneal in an inert gas such as nitrogen ($N_2$) is used to recrystallize wafer 34 using non-amorphized upper region 36 as a seed.

Figure 5:
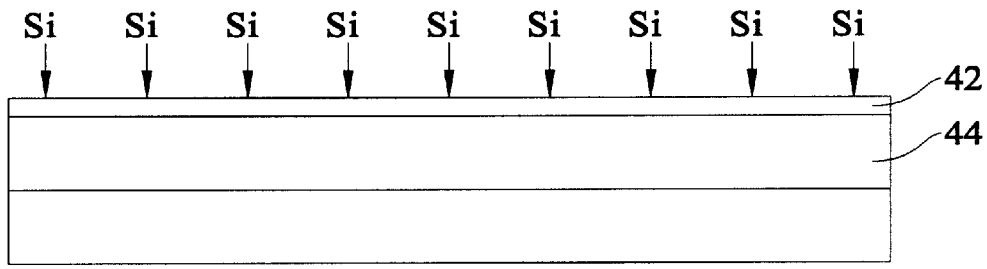

The next step is illustrated in FIG. 5 wherein silicon at surface layer 42 is amorphized by using a shallow implant of $Si^{28}$ at an energy level of 100 KeV and an implant dose of $10^{15}$ ions/cm$^2$ for example.

Figure 6:
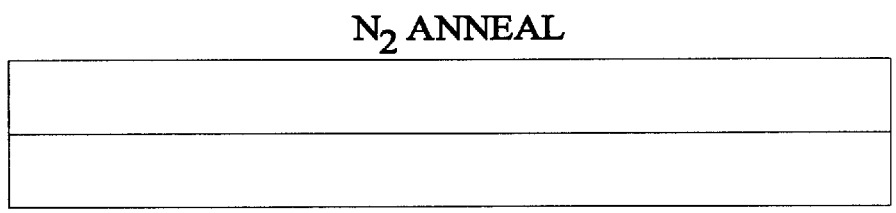

Referring to FIGS. 5 and 6, the recrystallization process is completed with a final anneal in an ambient gas such as $N_2$ that recrystallizes the silicon surface layer 42 using non-amorphized bottom layer 44 as a seed.

Figure 7:
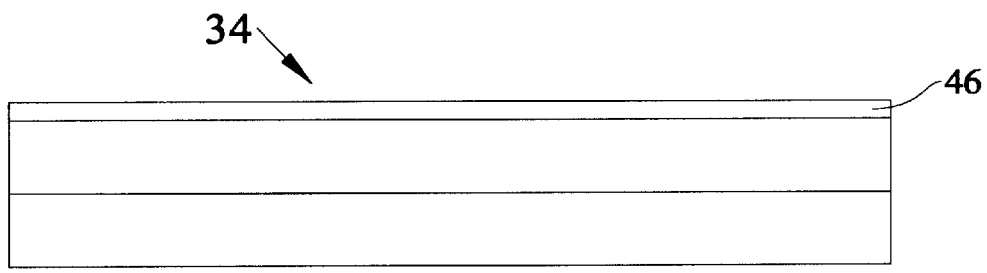

Following the annealing and prior to ion implantation, a thin oxide layer 46 illustrated in FIG.7 is grown uniformly across wafer 34. An oxide layer found suitable is approximately 0.025 micrometers thick, however other thicknesses may prove suitable as well.

Figure 8:
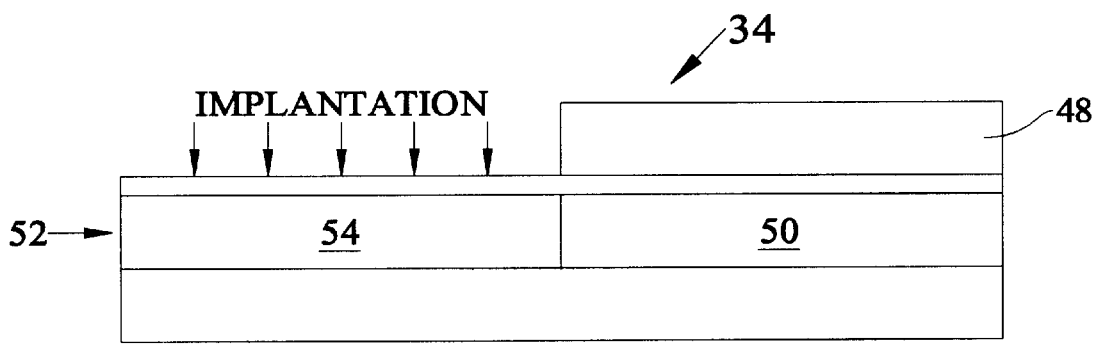

In FIG. 8 an implantation is performed to form a P+ region in wafer 34 to begin the formation of collector region 20 of PNP transistor 12 illustrated in FIG. 1. Wafer 34 is coated with photoresist, and the photoresist is removed in the region where implantation is desired. The technique of depositing photoresist onto a wafer and selectively removing it in specific regions of the wafer creates a mask or pattern and is well-known to those of ordinary skill in the art of semiconductor processing.

Referring again to FIG. 8, photoresist 48 is used to mask region 50 of silicon layer 52. Masking prevents the implanted ions from penetrating into region 50. Where there is no photoresist masking, region 54 of silicon layer 52 is implanted with ions that penetrate the region. Implantation that may used to produce the desired P+ region is a boron implantation of $BF_2$ gas at 30 KeV with a dose of $1.5\times10^{15}$ ions/cm$^2$ followed by a second dose of $1.5\times10^5$ ions/cm$^2$ at 70 KeV, for example. After the implantation step illustrated in FIG.8, the photoresist layer 48 is removed by a conventional method such as by ashing, for example.

Figure 9:
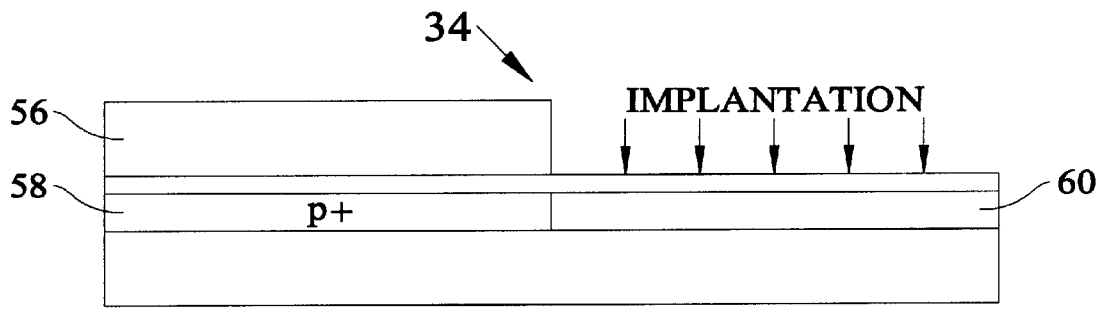

FIG. 9 illustrates a process used to create an N+ region in wafer 34 that is part of sub-collector region 26 of NPN vertical transistor 14 illustrated in FIG. 1. Photoresist layer 56 is produced by coating all of wafer 34 with photoresist and selectively removing the resist from certain regions of the wafer as is well-known to those knowledgeable in the art of semiconductor processing. Implantation to form the N+ region may utilize arsenic (As) ions for example at 80 KeV at a does of $3\times10^{15}$ ions/cm$^2$. Photoresist layer 56 prevents the ions from penetrating into region 58. However the As ions readily penetrate into region 60 of wafer 34.

Figure 10:
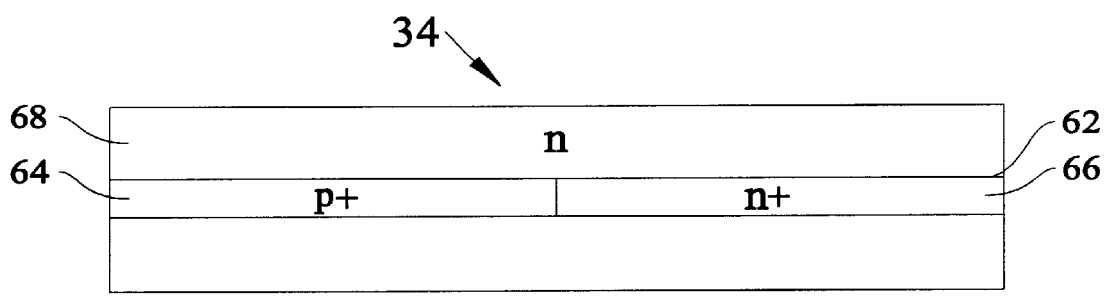

FIG. 10 illustrates the next step of the process. The oxide layer is first removed in region 62 above the P+ and N+ regions 64 and 66, respectively. Oxide removal can be accomplished by etching for example, or another technique well-known to those knowledgeable in the art of semiconductor processing. A silicon layer 68 is then epitaxially grown on wafer 34. For purposes of this invention, this layer is approximately 2.5 micrometers thick, however layers of other thicknesses may work as well. This layer is doped for N-type conductivity and may contain arsenic of approximately $10^{16}$ ions/cm$^3$ for example. Layer 68 acts as the intrinsic base for the PNP transistor and the collector for the NPN transistor.

Figure 11:
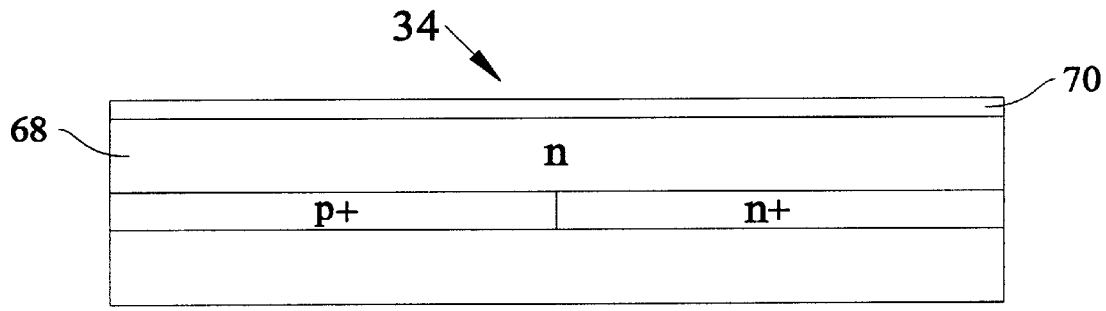

FIG. 11 illustrates the next step in the wafer processing. A thin oxide layer 70 is grown on N-type layer 68 of wafer 34. Oxide layer 70 is thermally grown to 250 angstroms thick and is used as a masking layer.

Figure 12:
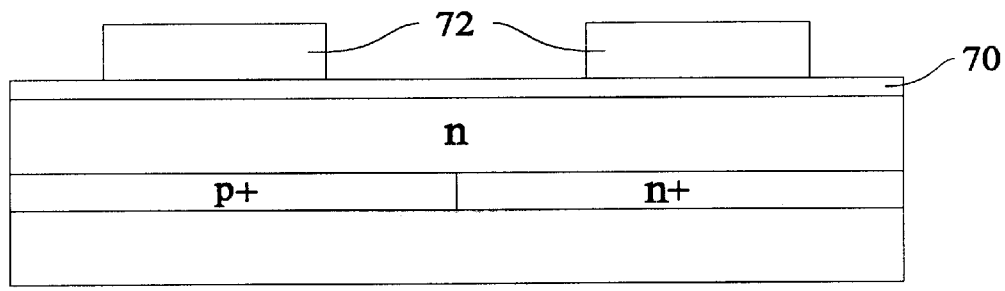
Figure 13:
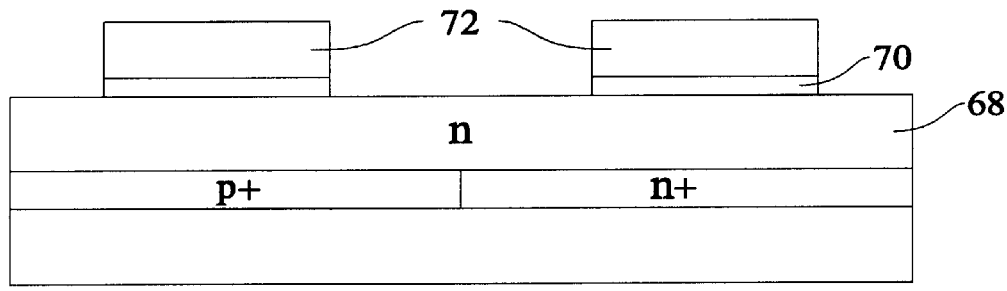

After growth of the oxide layer, a photoresist mask or pattern 72 is placed on oxide layer 70 as illustrated in FIG. 12. The photoresist mask is used to define island regions. As illustrated in FIG. 13, oxide layer 70 is removed by etching in regions where the oxide layer is not protected by photoresist pattern 72. Such etching may be performed by using a buffered oxide etch for example or by any other technique known to those skilled in the art.

Figure 14:
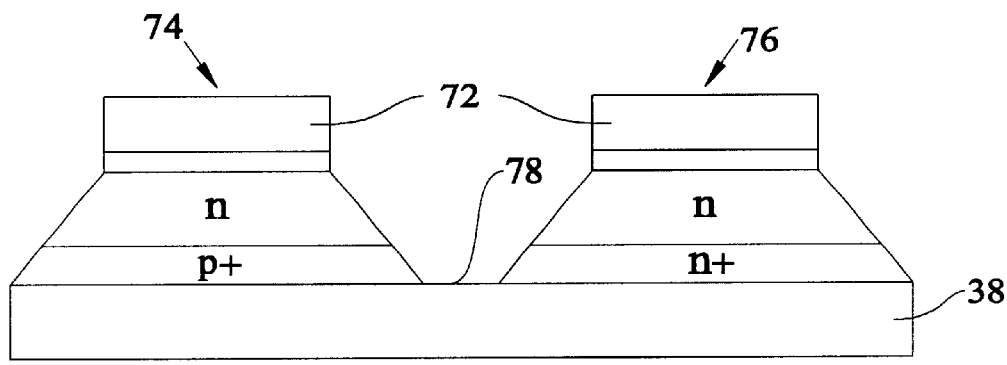
Figure 15:
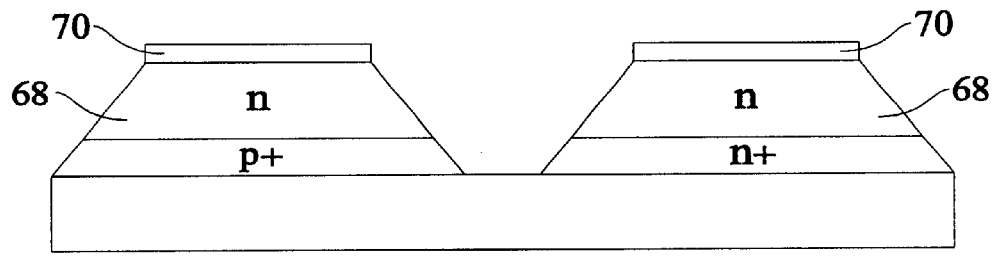
Figure 16:
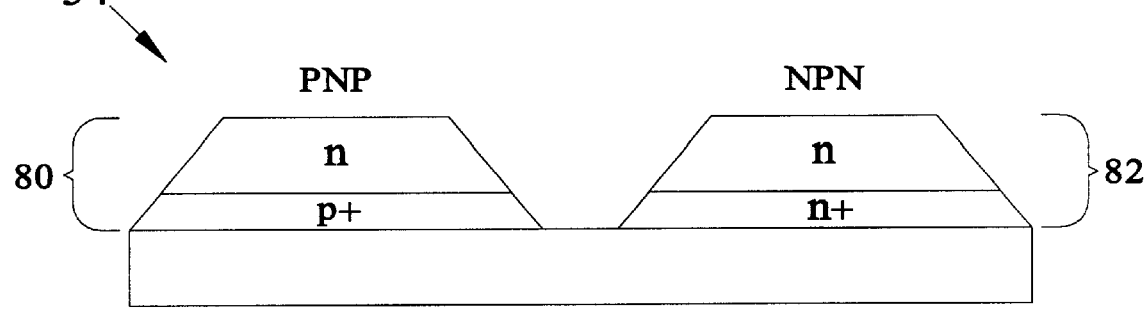

In FIG. 14, a subsequent etching takes place such as that which may be produced by a potassium hydroxide etching at an elevated temperature of approximately 100° C. for example, to remove undesired silicon material. The removal of silicon is desired to define islands 74 and 76, and to remove any silicon in region 78 down to insulating sapphire layer 38. Photoresist pattern 72 is then removed by ashing, for example or any other suitable method, as shown in FIG. 15. Another etching step is shown in FIG. 16 and may be performed with a buffered oxide, for example or other sufficient technique. This etching step is required to remove the remaining oxide 70 from wafer 34. Island 80 will eventually become a PNP vertical transistor, while island 82 will eventually become a NPN vertical transistor.

Figure 17:
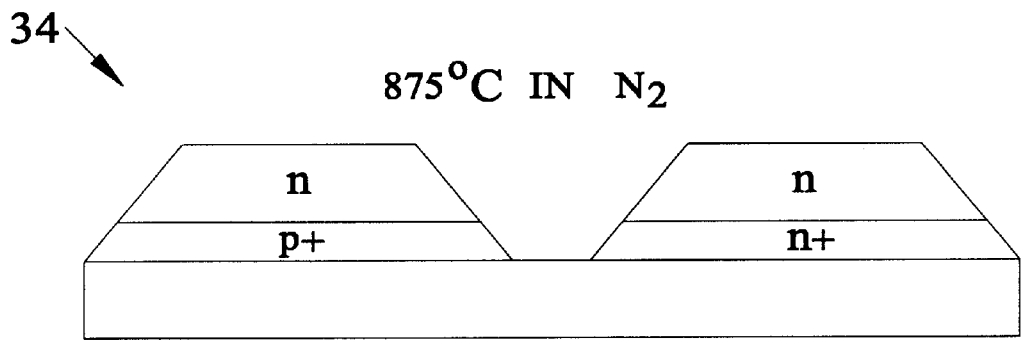
Figure 18:
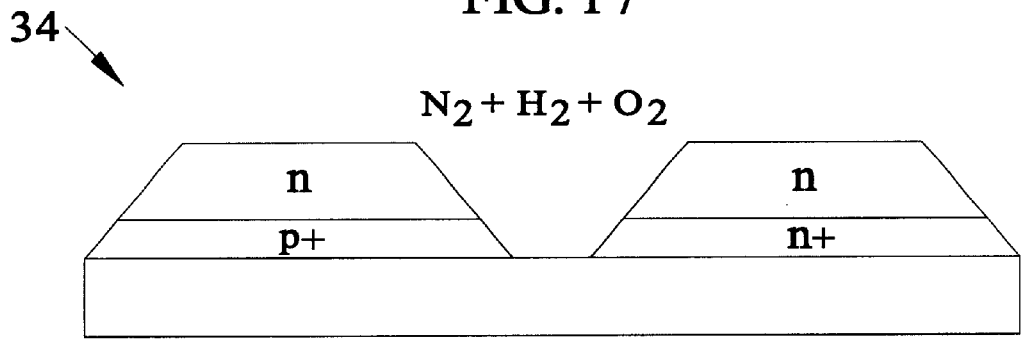
Figure 19:
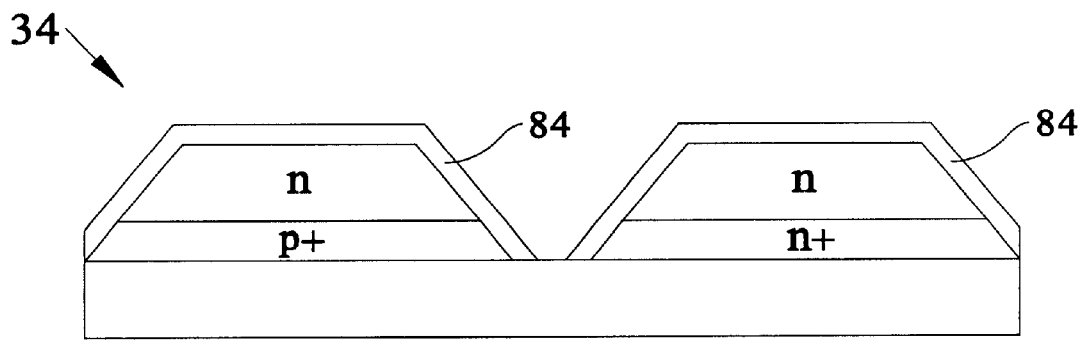

Wafer 34 then goes through an oxide growth stage as illustrated in FIGS. 17–19. At the beginning of this stage, as illustrated in FIG. 17, wafer 34 is placed in a furnace at approximately 875° C. for example. Initially, the ambient gas in the furnace may be $N_2$ for example. As shown in FIG. 18 once wafer 34 is completely contained inside the furnace, hydrogen and oxygen may be added to the ambient nitrogen to provide an oxidizing atmosphere for oxide growth of approximately 250 angstroms, for example. After the growth of oxide layer 84 as illustrated in FIG. 19, wafer 34 is slowly pulled out of the furnace into a controlled environment such as pure nitrogen gas.

Figure 20:
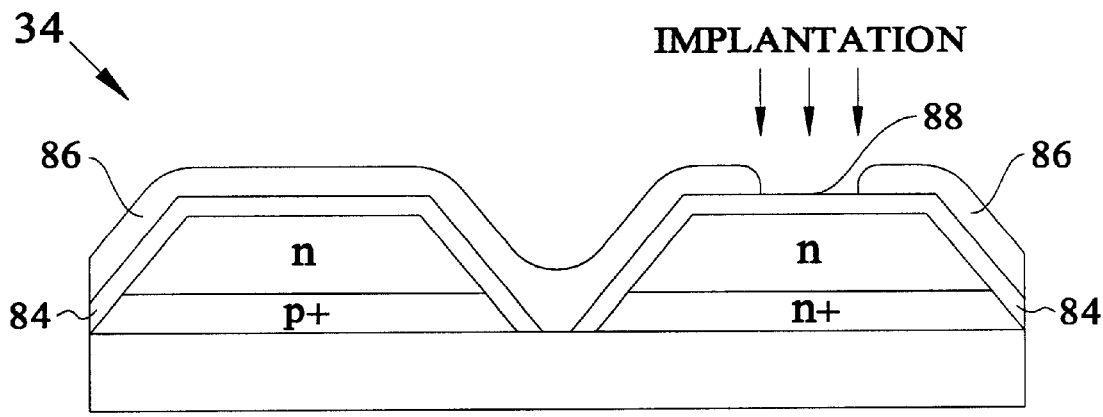

Referring to FIG. 20, after the oxide growth, wafer 34 is patterned with photoresist layer 86 to produce the intrinsic base region for the NPN transistor. Open patterned area 88 defines a region for an active P-doped base area for the NPN vertical transistor to be fabricated. As illustrated in FIG. 20, wafer 34 is implanted with a P-type dopant such as boron, applied at the appropriate dose and energy level to yield desired electrical results. In general, the desired electrical results comprise preselected ranges of values for the breakdown voltage, current gain, leakage current and frequency response which enhance the operation of the complementary vertical bipolar transistors fabricated according to the invention.

Figure 21:
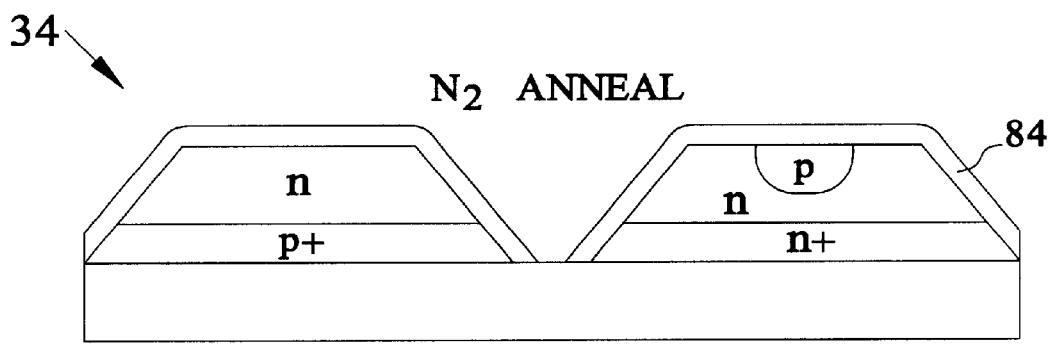

Following the implantation step illustrated in FIG. 20, photoresist layer 86 is removed by ashing for example. As illustrated in FIG. 21, placing wafer 34 inside an oven anneals the damage done during implantation and moves inactive implanted species into the crystal lattice of the silicon, making it electrically active. The ambient gas used may be nitrogen and the furnace temperature may be approximately 900–950° C. for example.

In the next step of processing, both the extrinsic base region of the NPN transistor and the emitter region of the PNP transistor are fabricated by ion implantation.

Figure 22:
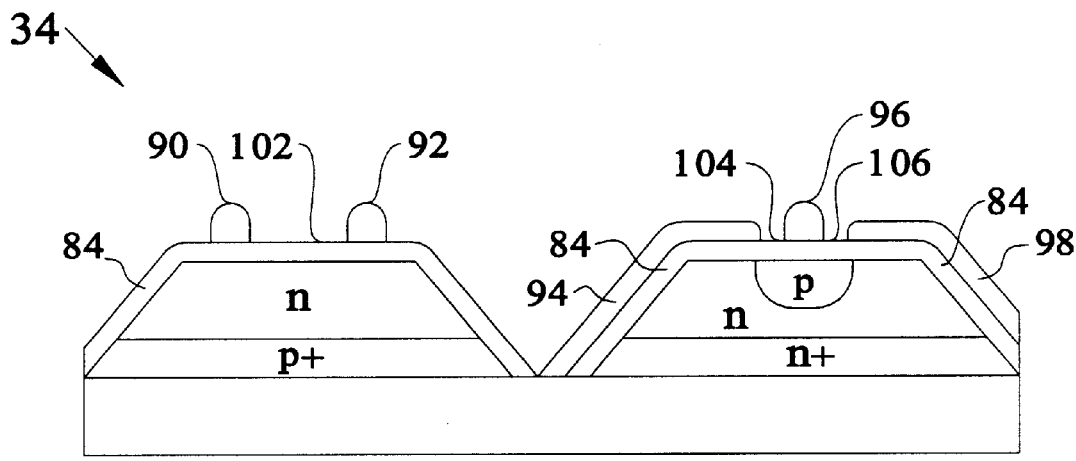
Figure 23:
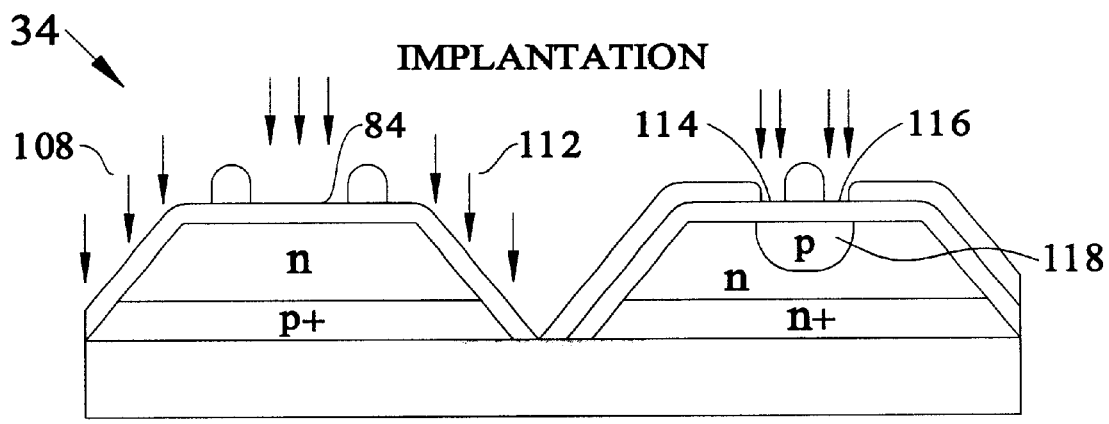
Figure 24:
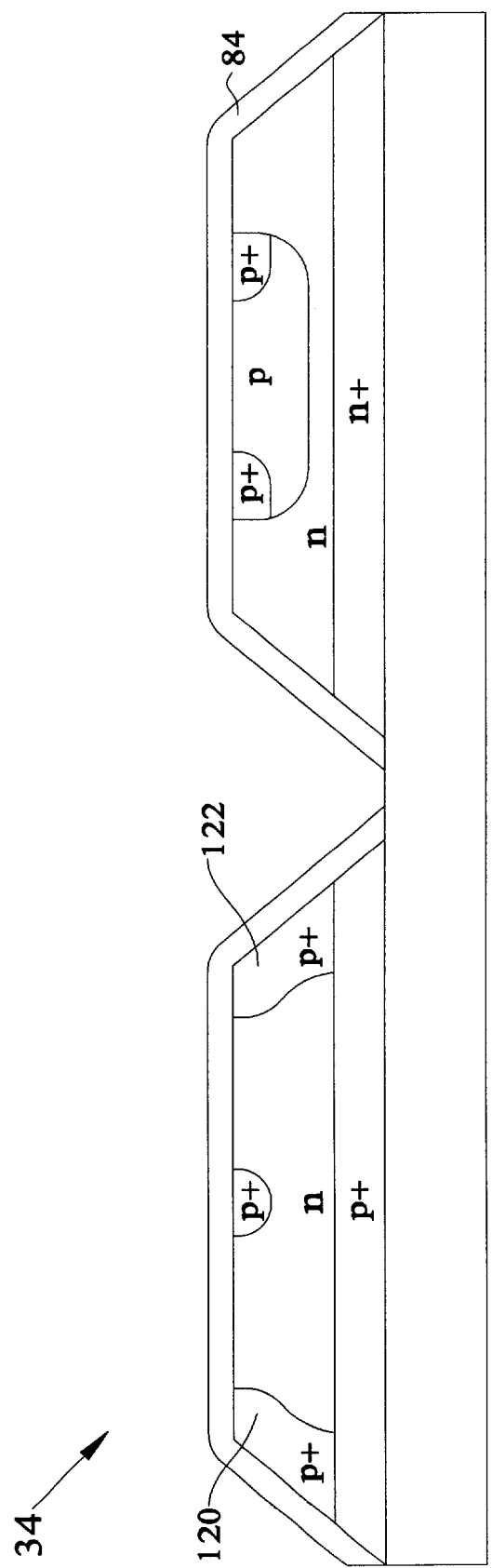

As illustrated in FIG. 22, photoresist layers 90, 92, 94, 96 and 98 form a pattern on oxide layer 84. Open patterned area 102 defines the emitter region for the PNP transistor. Open patterned areas 104 and 106 define the extrinsic base region for the NPN transistor. As illustrated in FIG. 23, wafer 34 is implanted with boron ions at an appropriate dose and a high energy level to yield desired electrical results, for example, dose of $10^{17}$ ions/cm$^2$ at 650 KeV. The high energy ions permit penetration of the boron into open areas 108, 84 and 112 illustrated in FIG. 23 as well as in the open patterned areas 114 and 116. The opened pattern areas 114 and 116 define regions to which metal will make eventual contact to form an ohmic contact to the intrinsic base region 118 illustrated in FIG. 22 of the vertical NPN transistor. Penetration of the boron into areas 108 and 112 illustrated in FIG. 23 produces collector plugs 120 and 122, shown in FIG. 24. Collector plugs 120 and 122 are incorporated into the structure of the vertical PNP transistor fabricated according to the invention to help reduce series collector resistance. Following the implantation step illustrated in FIG. 23, photoresist layers 90, 92, 94, 96 and 98 illustrated in FIG. 22 are removed by ashing or by plasma etching for example as illustrated in FIG. 24.

Figure 25:
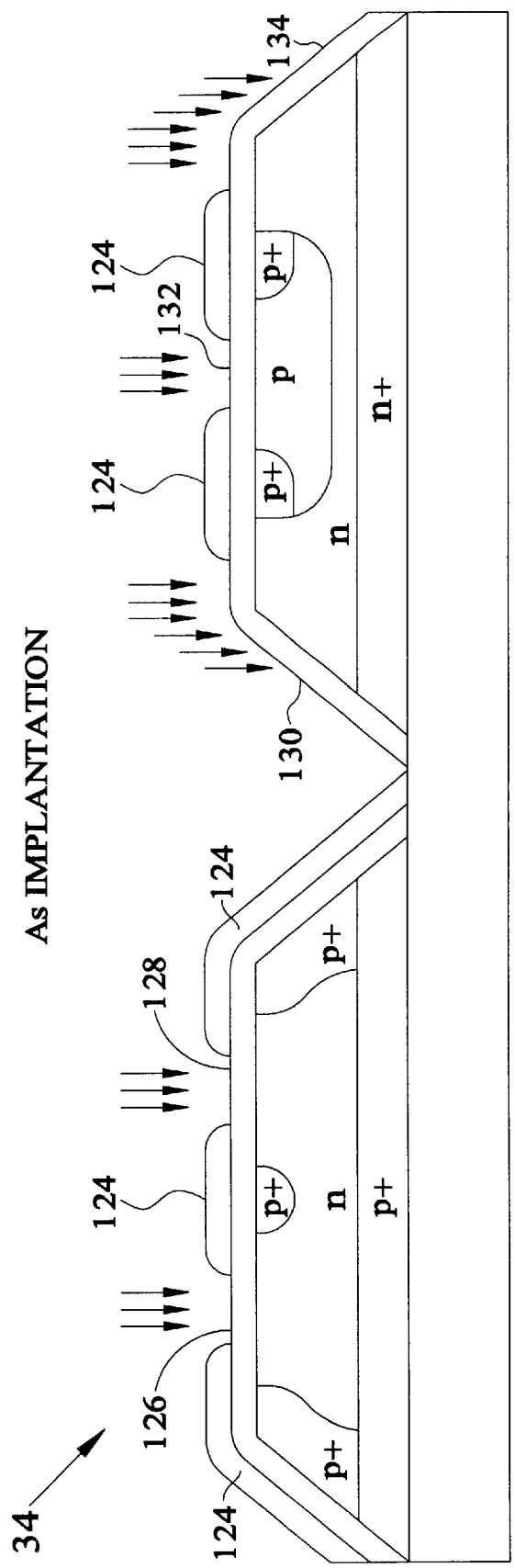

FIG. 25 illustrates the next step in the processing of the vertical bipolar junction transistors. In this step the extrinsic base contacts for the PNP transistor and the emitter for the NPN transistor are fabricated. Wafer 34 is patterned with photoresist 124 to include open areas 126, 128, 130, 132 and 134. Implantation of arsenic (As) as shown, may be used to create N+ areas in wafer 34. The dosage and energy of the implantation are relatively high and are selected to produce the desired electrical results, for example, a dose of As ions of $5 \times 10^{21}$ ions/cm$^2$ at 150 KeV. The open pattern areas 126 and 128 define regions to which metal will make eventual contact to form an extrinsic base to the PNP transistor. Open pattern region 132 defines the region that is to form the emitter region of the NPN transistor. Penetration of the As into areas 130 and 134 produces collector plugs in regions 136 and 138 shown in FIG. 26. Collector plug regions 136 and 138 are incorporated into the sub-collector region of the vertical NPN transistor fabricated according to the invention to help reduce series collector resistance.

Figure 26:
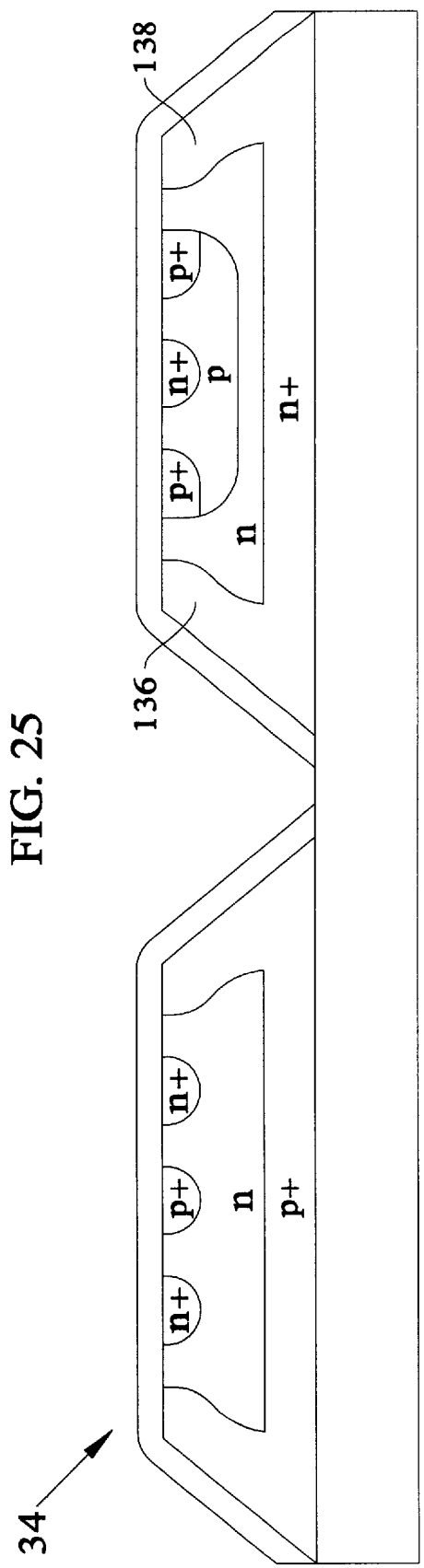
Figure 27:
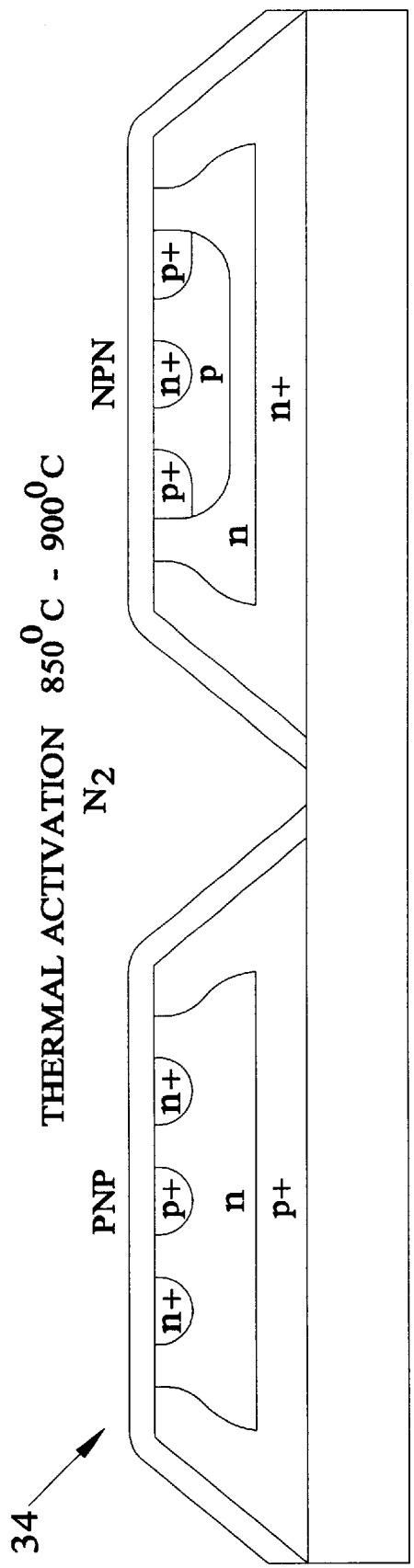

Following implantation the photoresist is removed by ashing or other typical means as illustrated in FIG. 26. The impurities that are implanted into wafer 34 are activated by a thermal method as illustrated in FIG. 27. This method comprises inserting the wafer in a furnace of nitrogen atmosphere. The temperature is then ramped up to a predetermined value, generally in the range of 850 C. to 900 C. This thermal temperature serves to both anneal the damage done to the crystalline lattice by ion implantation as well as to move the substitutional impurities into the crystalline lattice to make them electrically active.

Figure 28:
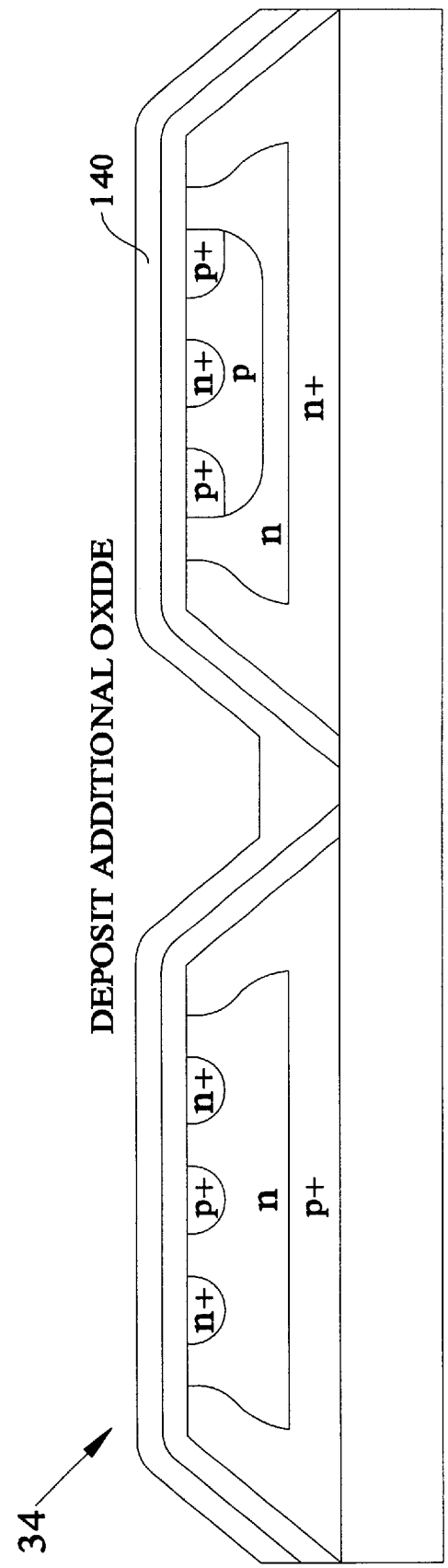
Figure 29:
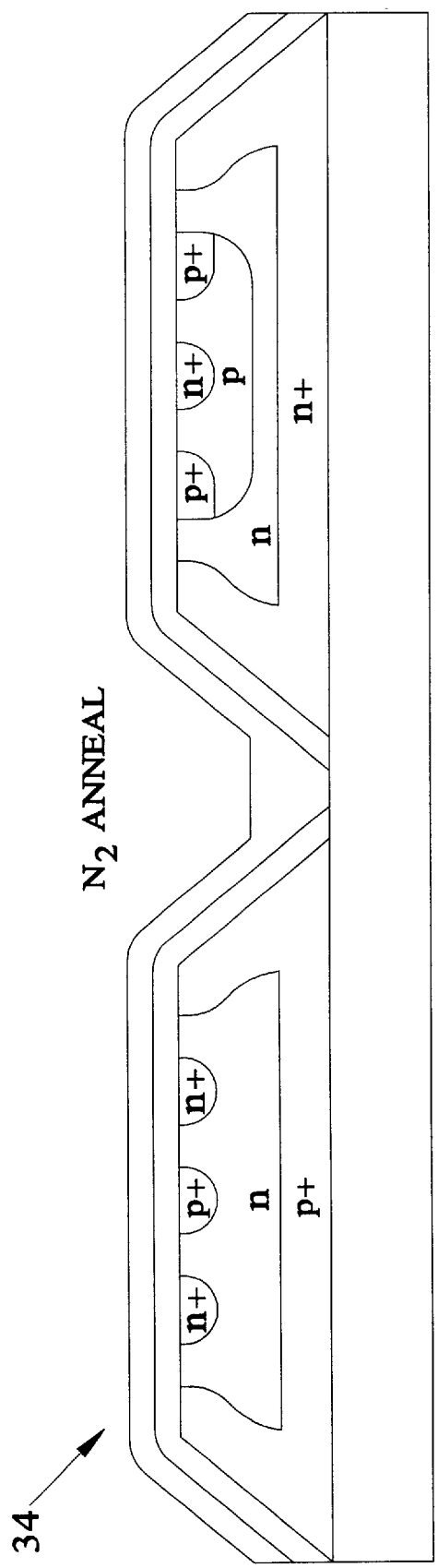
Figure 30:
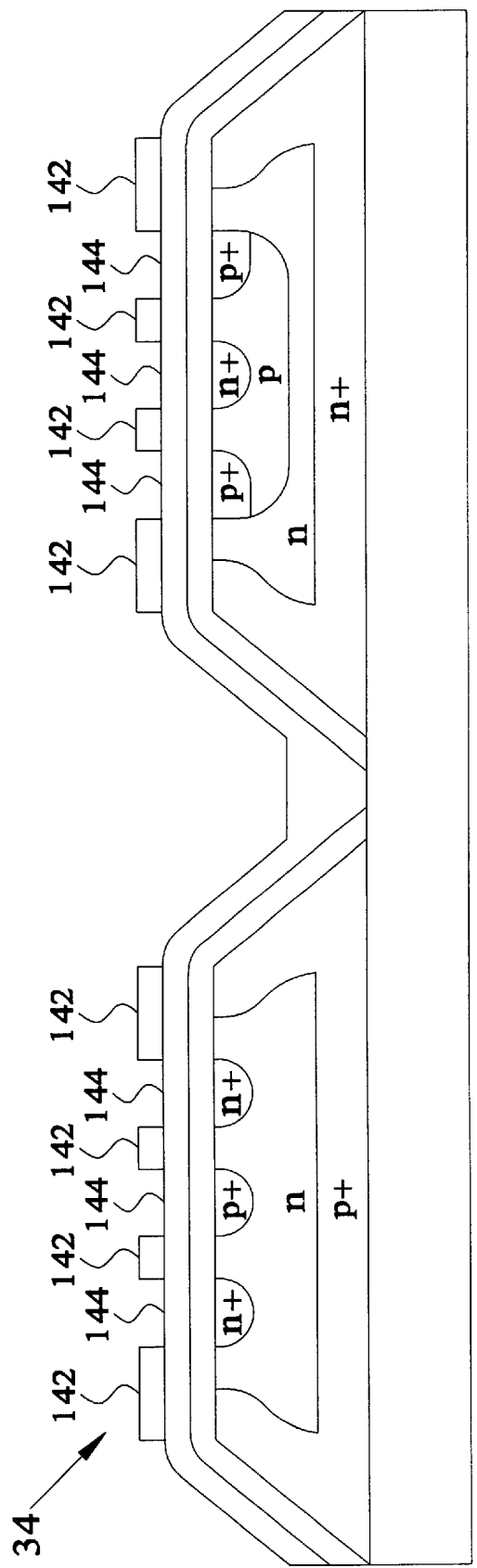

Following the thermal activation step illustrated in FIG. 27, additional steps of metal deposition, etching and annealing are performed as illustrated in FIGS. 28–34. As illustrated in FIG. 28, a layer of additional oxide 140 is deposited. This layer may be 0.5 micrometers thick for example. As shown in FIG. 29 wafer 34 is annealed in a controlled ambient such as nitrogen (N$_2$) at a temperature of 850C. for one hour. FIG. 30 shows photoresist mask 142 in place to define areas 144 of wafer 34 to which conducting metal will eventually be deposited. Photoresist mask 142 is known as the contact level mask.

Figure 33:
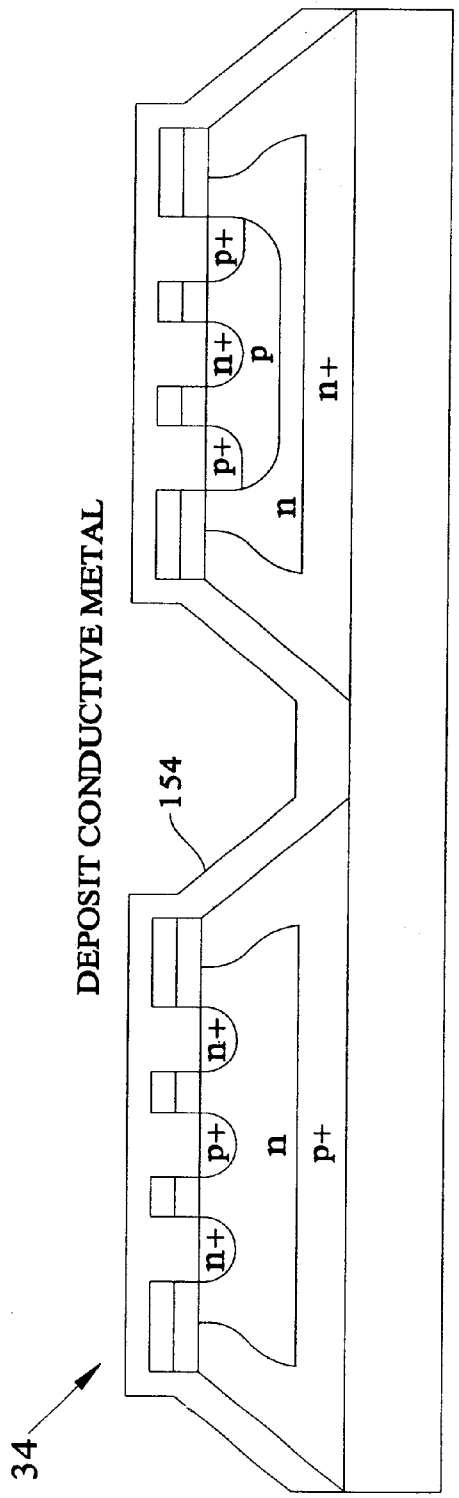

As can be seen in FIGS. 31 and 32, previously deposited oxide layer 84 of FIG. 19 and oxide layer 140 of FIG. 28 have been etched by way of a buffered oxide etch, for example, to expose areas 146, 148, 150 and 152. In FIG. 32 photoresist contact mask 142, shown in FIG. 31, is removed by ashing, for example. As illustrated in FIG. 33 conducting metal 154 is deposited on wafer 34. The conducting metal may be 1 micrometer thick, for example, and include of aluminum containing 1% silicon, for example. Of course, other suitable conductors may be used as well.

Figure 34:
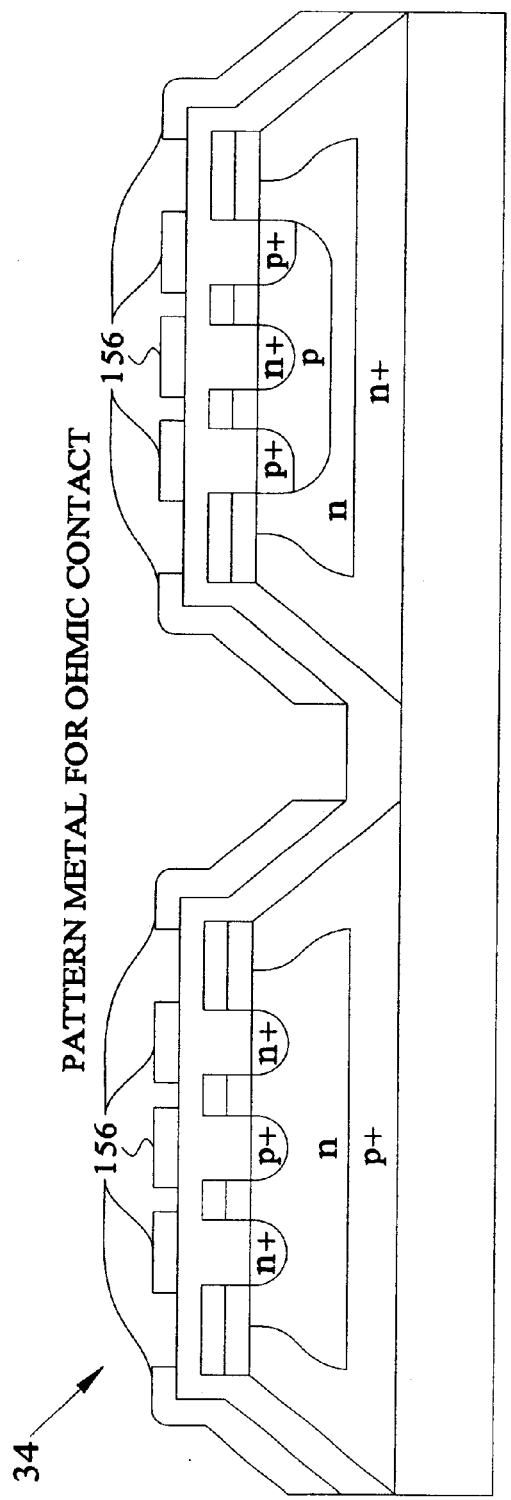
Figure 37:
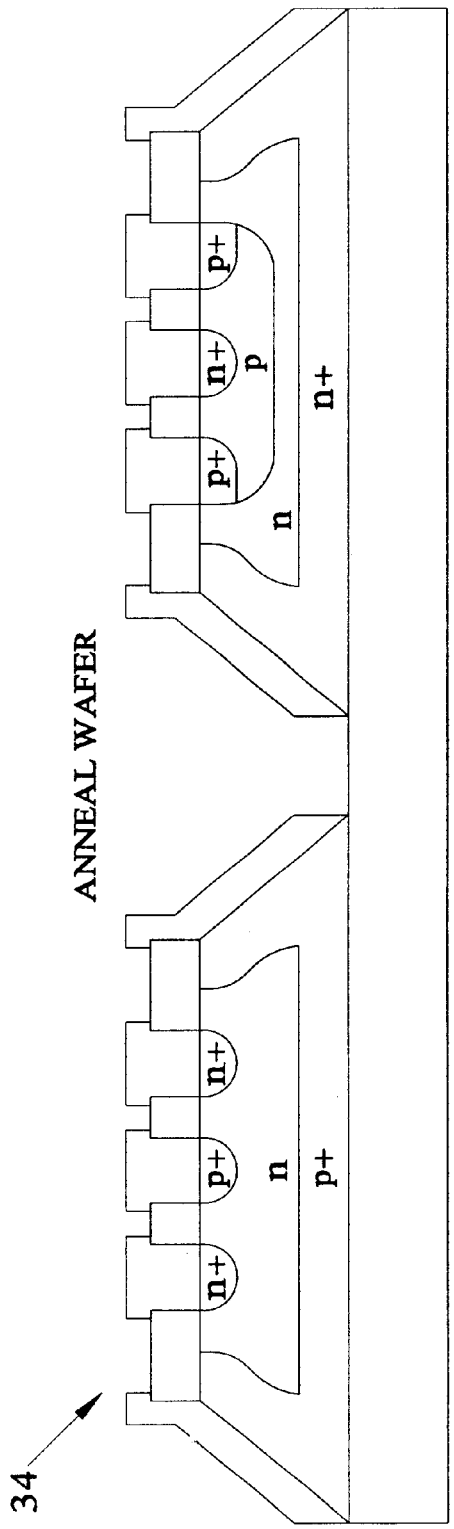

In FIG. 34, photoresist mask 156 is deposited in a pattern to define the areas where conducting metal is to remain to provide ohmic contacts for the complementary bipolar junction transistors fabricated according to the invention. In FIG. 35 the conducting metal is etched, as by plasma etching or other suitable method, for example. Following the etching of the conducting metal, wafer 34 includes photoresist pattern 156, conducting metal pattern 158 and oxide pattern 160 as illustrated in FIG. 35. The next step removes photoresist mask 156 from wafer 34 as illustrated in FIG. 36. Removal of mask 154 may be accomplished by ashing or plasma etching or other sufficient method for example. In FIG. 37 wafer 34 undergoes an annealing step at an exemplary temperature of 400 C. This step sinters the metal aluminum composition in the silicon to provide good ohmic contact to the complementary bipolar junction transistors.

Figure 38:
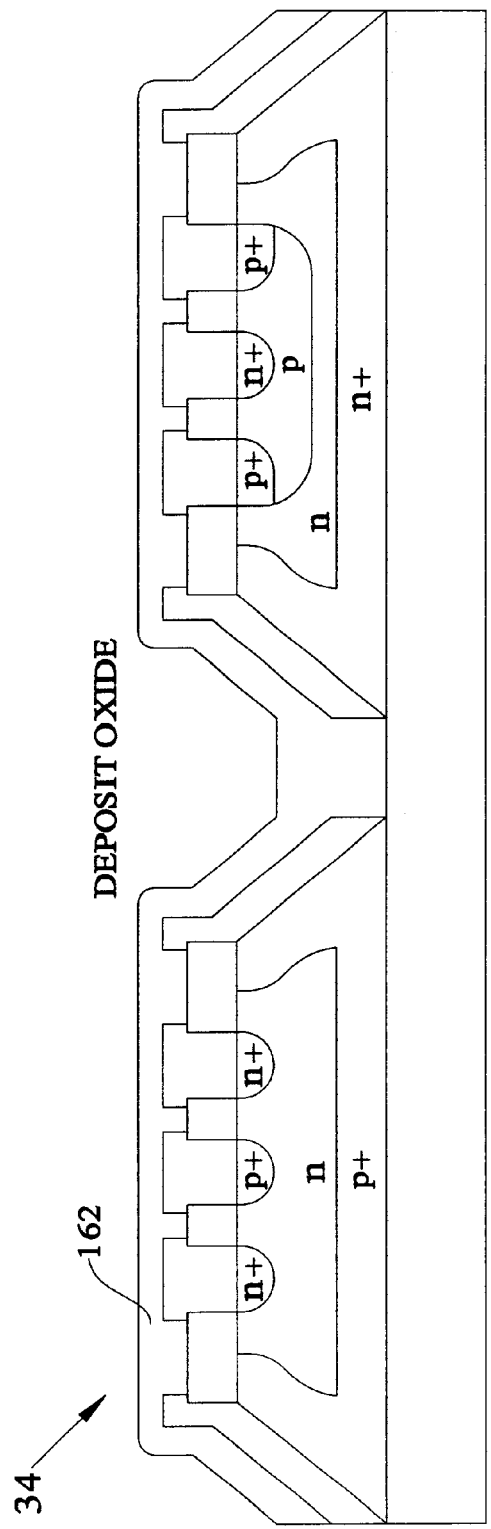
Figure 41:
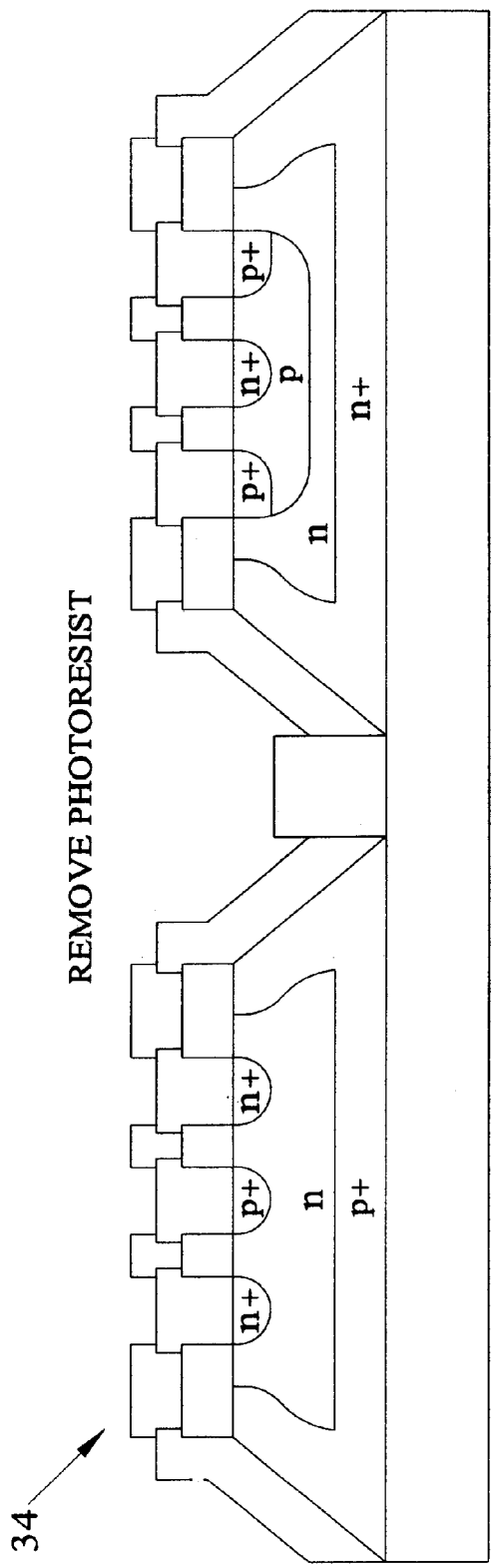

In FIG. 38 an additional oxide layer 162 is deposited. The oxide layer may have a thickness of 0.5 micrometers for example. In FIG. 39 oxide photoresist pattern 164 is deposited over oxide layer 162 to define regions on wafer 34 where the oxide will remain. FIG. 40 illustrates the etching of the oxide throughphotoresist pattern 164, and FIG. 41 shows the removal of the photoresist by ashing or other suitable method for example.

Figure 42:
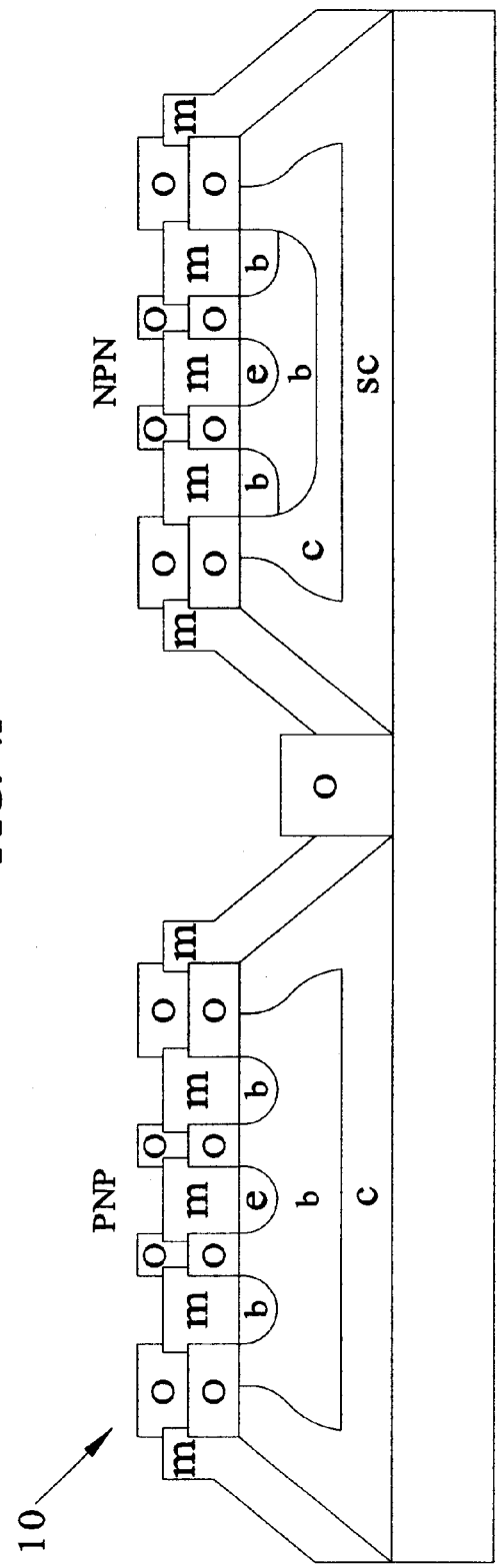
FIG. 42 illustrates a cross-sectional view the complementary vertical bipolar junction transistors according to the invention.

FIG. 42 shows complementary vertical bipolar junction transistors 10 fabricated according to the steps disclosed in FIGS. 2–41. The vertical PNP and NPN transistors are illustrated in cross section and the letters "sc", "c", "b" and "e" denote the sub-collector, collector, base and emitter, respectively. Further, the letters "m" and "o" indicate regions containing conducting metal and oxide, respectively.

Obviously, many modifications and variations of the invention are possible in light of the above teachings. It is therefore to be understood that within the scope of the appended claims the invention may be practiced other that as has been specifically described.

What is claimed is:

1. A complementary vertical bipolar junction transistor apparatus comprising:
    a sapphire substrate;
    a PNP transistor including:
        a P+ region formed of an island of recrystalized silicon disposed on said sapphire substrate, and P+ region being a collector region;
        an N intrinsic base silicon region disposed on said P+ region;
        a P+ emitter region disposed within said N base region;
        N+ extrinsic base regions disposed within said N base region;
        individual conducting metal contacts operably coupled to said emitter, said extrinsic base regions and disposed on sidewalls of said collector region; and
        an oxide disposed between said conducting metal contacts,
    a NPN transistor including:
        an N+ region formed of an island of recrystalized silicon disposed on said sapphire substrate and separated from said PNP transistor, said N+ region being a subcollector region;
        an N collector silicon region disposed on said N+ region;
        a P intrinsic base region disposed within said N collector silicon region;
        an N+ emitter region disposed within said P base region;
        P+ extrinsic base regions in said P intrinsic base region;
        individual conducting metal contacts operably coupled to said emitter, said extrinsic base regions and disposed on sidewalls of said collector region; and
        an oxide region disposed between said conducting metal contacts; and
    an oxide region disposed on said sapphire substrate between said PNP and NPN transistors.

2. The apparatus according to claim 1 wherein said recrystallization is done by a double solid phase epitaxy technique.

3. The apparatus according to claim 1 wherein said silicon layer on said sapphire substrate is approximately 0.3 micrometers thick.

4. The apparatus according to claim 1 wherein said N, N+, P and P+ regions are created through ion implantation.

5. The apparatus according to claim 1 wherein said N intrinsic base silicon region and said N collector silicon region are approximately 2.5 micrometers thick.

6. The apparatus according to claim 1 wherein arsenic ion implantation is used to produce said N-type and N+type regions.

7. The apparatus according to claim 1 wherein boron ion implantation is used to produce said P-type and P+-type regions.

* * * * *